US005634001A

United States Patent [19]
Mittl et al.

[11] Patent Number: 5,634,001
[45] Date of Patent: May 27, 1997

[54] METHOD TO CALCULATE HOT-ELECTRON TEST VOLTAGE DIFFERENTIAL FOR ASSESSING MICROPROCESSOR RELIABILITY

[75] Inventors: Steven W. Mittl, Essex; David E. Moran, South Burlington; Timothy J. O'Gorman, Williston; Kimball M. Watson, Essex Junction, all of Vt.

[73] Assignee: International Business Machines Corporation, Armonk, N.Y.

[21] Appl. No.: 474,441

[22] Filed: Jun. 7, 1995

[51] Int. Cl.$^6$ .............. G01R 31/30; G06F 11/25
[52] U.S. Cl. .............. 395/183.09; 395/183.16; 395/185.08; 371/28
[58] Field of Search .......... 395/185.08, 183.09, 395/183.16, 183.13, 183.01, 500; 371/22.1, 22.6, 28, 61, 62; 324/535, 532, 522

[56] References Cited

U.S. PATENT DOCUMENTS

| | | | |
|---|---|---|---|
| 4,502,140 | 2/1985 | Proebsting | 371/28 |
| 4,642,492 | 2/1987 | Beck et al. | 307/578 |
| 4,870,575 | 9/1989 | Rutenberg | 364/300 |
| 4,907,230 | 3/1990 | Heller et al. | 371/22.1 |
| 4,928,062 | 5/1990 | Miles et al. | 324/158 R |
| 5,134,447 | 7/1992 | Ng et al. | 357/23.4 |
| 5,208,765 | 5/1993 | Turnbull | 364/552 |
| 5,223,792 | 6/1993 | El-Ayat et al. | 324/158 R |
| 5,262,683 | 11/1993 | Cook | 307/263 |
| 5,278,769 | 1/1994 | Bair et al. | 364/490 |
| 5,296,401 | 3/1994 | Mitsui et al. | 437/57 |
| 5,306,655 | 4/1994 | Kurimoto | 437/44 |
| 5,383,194 | 1/1995 | Sloan et al. | 371/22.1 |
| 5,533,197 | 7/1996 | Moran et al. | 395/185.08 |

OTHER PUBLICATIONS

Raje. "Accurate Delay Models for Digital BICMOS", IEEE Transactions of Electron Devices, vol. 39, No. 6, pp. 1426-1464 Jun. 1992.

Najm. "Transistion Density: A New Measure of Activity in Digital Circuits", IEEE Transactions on Computer Aided Design of intergrated Circuits and systems, vol. 12, No. 2, pp. 310-323 Feb. 1993.

*Primary Examiner*—Hoa T. Nguyen
*Assistant Examiner*—Joseph E. Palys
*Attorney, Agent, or Firm*—Calfee, Halter & Griswold LLP

[57] ABSTRACT

A method and system are provided for determining a guard band voltage differential for testing a microprocessor. The guard band voltage differential approximates microprocessor circuit propagation delay degradation expected to occur over the life of the microprocessor. The system and method are performed by first partitioning a microprocessor into a plurality of cones of n circuit level models. Timing simulation data and degradation data are created to represent, respectively, the timing operation for each of the circuit level model circuit paths, and the hot-electron effects on propagation delay degradation for each of the circuit level models. Propagation delay is identified using this data for each of the circuit paths for the circuit level models at times corresponding to the beginning-of-life and end-of-life of the microprocessor. Propagation delay degradation is calculated as the difference between the propagation delay at these times. A range of applied power supply voltages necessary to successfully perform a functional test of the microprocessor over a corresponding range of microprocessor cycle times is experimentally determined. Based on the calculated propagation delay degradation and on the range of applied power supply voltages, a guard band voltage differential for testing the microprocessor is determined.

9 Claims, 5 Drawing Sheets

FROM FIGURE 6A

```
┌─────────────────────────────────────────────────────────────────┐
│ USING TIMING SIMULATION DATA AND DEGRADATION DATA, IDENTIFY     │
│ PROPAGATION DELAY ($t_{pd(BOL)}$) FOR CIRCUIT PATHS AT BEGINNING- │
│ OF-LIFE AND PROPAGATION DELAY ($t_{pd(EOL)}$) FOR CIRCUIT PATHS AT │
│ END-OF-LIFE                                                     │
└─────────────────────────────────────────────────────────────────┘
```

```
┌─────────────────────────────────────────────────────────────────┐
│ CREATE BEGINNING-OF-LIFE (BOL) HISTOGRAMS AND END-OF-LIFE       │
│ (EOL) HISTOGRAMS, PROVIDING A HISTORY OF ALL THE                │
│ PROPAGATION DELAYS FOR ALL OF THE CIRCUIT PATHS IN A            │
│ MICROPROCESSOR                                                  │
└─────────────────────────────────────────────────────────────────┘
```

```
┌──────────────────────────────────────┐  ┌──────────────────────────────────┐
│ DETERMINE THE DIFFERENCE             │  │ EXPERIMENTALLY GRAPH APPLIED     │
│ BETWEEN THE DELAYS OF THE            │  │ POWER SUPPLY VOLTAGES $V_{dd}$   │
│ MOST CRITICAL CONES AT THE           │  │ NECESSARY TO SUCCESSFULLY        │
│ MICROPROCESSOR BEGINNING OF          │  │ PERFORM A FUNCTIONAL MICRO-      │
│ LIFE (BOL) AND END OF LIFE           │  │ PROCESSOR TEST OVER A RANGE      │
│ (EOL) TO DETERMINE PROPAGATION       │  │ OF MICROPROCESSOR CYCLE          │
│ DELAY DEGRADATION:                   │  │ TIMES $t_{cycle}$                │
│ $\Delta t_{pd}(\tau) = t_{pd(EOL)} - t_{pd(BOL)}$ │  │                                  │
│ CAUSED BY HOT ELECTRON EFFECTS       │  │                                  │
└──────────────────────────────────────┘  └──────────────────────────────────┘
```

```
┌─────────────────────────────────────────────────────────────────┐
│ DETERMINE $V_{dd(guard-band)}$ VOLTAGE, BASED ON PROPAGATION DELAY │
│ DEGRADATION $\Delta t_{pd}(\tau)$ AND EXPERIMENTALLY OBTAINED $V_{dd}$ VS. $t_{cycle}$ │
│ GRAPH, AS $V_{dd@BOL} - V_{dd@EOL}$, AND STORE RESULTS IN OUTPUT FILES │
└─────────────────────────────────────────────────────────────────┘
```

```
┌─────────────────────────────────────────────────────────────────┐
│ TEST MICROPROCESSORS USING $V_{dd(guard-band)}$ VOLTAGE         │
│ DIFFERENTIAL AND STORE TEST RESULTS IN OUTPUT FILES             │
└─────────────────────────────────────────────────────────────────┘
```

FIG. 6B

METHOD TO CALCULATE HOT-ELECTRON TEST VOLTAGE DIFFERENTIAL FOR ASSESSING MICROPROCESSOR RELIABILITY

FIELD OF THE INVENTION

The present invention relates generally to microprocessor reliability analysis methods, and more particularly to methods for determining appropriate test voltages for assessing microprocessor reliability over microprocessor lifetime, while accounting for circuit propagation delay degradation caused by the hot-electron effect.

RELATED APPLICATION

The following United States patent application is incorporated herein by reference as if it had been fully set out: application Ser. No. 08/327,151, filed Oct. 21, 1994, now U.S. Pat. No. 5,533,197, entitled "METHOD TO ASSESS ELECTROMIGRATION AND HOT ELECTRON RELIABILITY FOR MICROPROCESSORS".

BACKGROUND

Complementary metal oxide semiconductor (CMOS) microprocessors typically comprise one or more integrated circuit (IC) chips. Each IC chip includes thousands and perhaps millions of field effect transistors (NFETS and PFETS) which are used to construct memory arrays, latches, and other combinatorial logic elements. These circuits must reliably store or process data during every microprocessor cycle ($t_{cycle}$) over the lifetime ($\delta$) of the microprocessor.

The term hot-electron (HE) effect refers to the phenomenon of electrons which originate from FET surface channel currents, from impact ionization currents at the FET drain junction, or from substrate leakage currents. Channel hot electrons originate from channel conduction current near the drain junction. Electrons drifting from the drain may gain sufficient energy to enter into the gate, or they may collide with the silicon atoms and generate electron-hole pairs. The hole adds to substrate current, and the secondary electron may be injected into the gate of a subsequent FET (see e.g., M. Annaratone, H.B. *Digital CMOS Circuit Design*, Kluwer Academic Publishers, Norwell Mass., p. 39, (1986)). As these secondary electrons accumulate in the gate, the FET threshold voltage $V_T$ shifts and the internal resistance of the device changes. Device current $I_d$ is proportional to both the internal resistance of the device and $(V_{GS}-V_T)^2$. Therefore, as the threshold voltage $V_T$ the internal resistance changes, the current drive capability $I_d$ of the device changes. This time dependent, drain current degradation $\Delta I_d(\tau)/I_d$ must be less than 0.1 according to conventional hot-electron reliability criteria.

Drain current degradation $\Delta I_d(\tau)/I_d$ is a wear-out effect which reduces circuit reliability, because it also causes circuit propagation delay degradation $\Delta t_{pd}(\tau)$, which may result in intermittent timing-faults over microprocessor circuit lifetime ($\delta$). Variances in the circuit propagation delay, $\Delta t_{pd}(\tau)/t_{pd}$ are proportional to the time dependent drain current degradation $\Delta I_d(\tau)/I_d$. Time dependent drain current degradation $\Delta I_d(\tau)/I_d$ and circuit propagation delay degradation $\Delta t_{pd}(\tau)/t_{pd}$ are both dependent on manufacturing process variations, circuit design, and microprocessor application factors of temperature, voltage and lifetime. The reduction in microprocessor reliability over circuit lifetime is especially applicable to microprocessors having short transistor channel lengths that are sensitive to hot-electron effects, because drain current degradation is proportional to the effective channel length of a transistor.

Accordingly, when assessing microprocessor reliability, circuit designers must attempt to determine time dependent drain current degradation $\Delta I_d(\tau)/I_d$. Because this term is proportional to variances in circuit propagation delay $\Delta t_{pd}(\tau)/t_{pd}$, the circuit designer may assess the drain current degradation by analyzing $\Delta t_{pd}(\tau)/t_{pd}$. Circuit propagation delay degradation which is caused by hot-electron effects may then be used to determine if a particular circuit satisfies established timing criteria. In doing so, designers insure proper timing of data and control signals propagating through the circuit, by insuring that the microprocessor tolerate circuit propagation delay degradation $\Delta t_{pd}(\tau)/t_{pd}$ caused by hot-electron effects.

The hot-electron effects on propagation degradation are considered during circuit level design for each transistor in the circuit (see, e.g. T. J. O'Gorman, ADCHECK Circuit Reliability Program, IBM® Microelectronics Division, May, 1994). Typically, microprocessors which are particularly sensitive to hot-electron effects are identified by testing a batch of microprocessors at a power supply voltage that is lower than the normal application voltage. The test is based on the principle that the lower test voltage has an adverse effect on microprocessor timing which is similar to that experienced by the microprocessor, due to propagation delay degradation, under normal application voltage at circuit end-of-life. Microprocessors so identified may then be discarded to improve the overall reliability of a particular distribution of microprocessors.

The difference between the normal application power supply voltage and the lower test voltage is referred to as the "guard-band", the magnitude of which must be properly determined in order to optimize the results of the microprocessor end-of-life timing degradation simulation. If the guard-band (voltage differential) is set too high, the test voltage will be lowered too much, reducing product yield. On the other hand, if the guard-band is set too low, the test voltage will not be lowered enough, reducing product reliability. Typically, the guard-band will be set too high or too low because it is not specifically tailored to the application specific logic and physical circuit design of the microprocessor.

It is therefore an object of the present invention to provide a self-calibrating method that quantifies the test voltage for a microprocessor's application specific technology, design, and environment, to accommodate for propagation delay degradation caused by hot-electron effects.

SUMMARY

A method and system are provided for determining a guard band voltage differential for testing a microprocessor. The guard band voltage differential approximates microprocessor circuit propagation delay degradation expected to occur over the lifetime of the microprocessor. By using the determined guard band voltage differential, the reliability of the microprocessor may be assessed over microprocessor lifetime while accounting for circuit propagation delay degradation caused by the hot-electron effect.

The system and method are performed by first partitioning a microprocessor into a plurality of cones of n circuit level models. Timing simulation data and degradation data are created to represent, respectively, the timing operation for each of the circuit level model circuit paths, and the hot-electron effects on propagation delay degradation for each of the circuit level models. Propagation delay is identified using this data for each of the circuit paths for the circuit level models at times corresponding to the beginning-of-life and end-of-life of the microprocessor. Propagation delay degradation is calculated as the difference between the propagation delay at these times. A range of applied power supply voltages necessary to successfully perform a functional test of the microprocessor over a corresponding range of microprocessor cycle times is then experimentally plotted. Based on the calculated propagation delay degradation, and on the plotted range of applied power supply voltages, a guard band voltage differential for testing the microprocessor is determined.

BRIEF DESCRIPTION OF THE DRAWINGS

FIGS. 6A and 6B, taken together, are a flow chart defining a preferred method for determining an appropriate test voltage for assessing microprocessor reliability which accounts for circuit propagation delay degradation caused by the hot-electron effect.

DETAILED DESCRIPTION OF A PREFERRED EMBODIMENT

Figure 1:
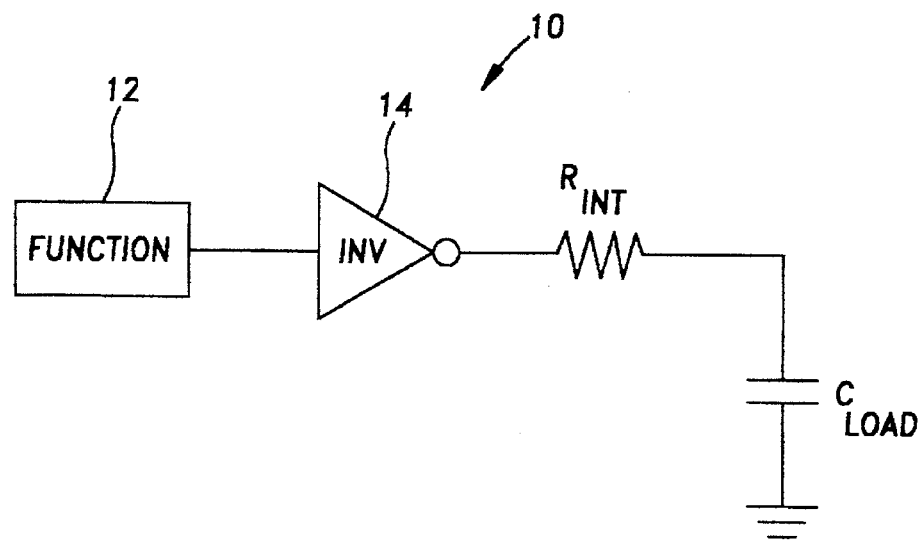
FIG. 1 is a simplified schematic of a circuit-level model of a circuit used in a microprocessor.

With reference to the drawings, FIG. 1 is a simplified schematic circuit-level model of a circuit 10 used in a microprocessor. The circuit 10 comprises (i) a Boolean function 12 the design of which accounts for hot-electron effects, (ii) an output driver such as an inverter 14, and (iii) a load comprised of a capacitance $C_{load}$.

Figure 2:
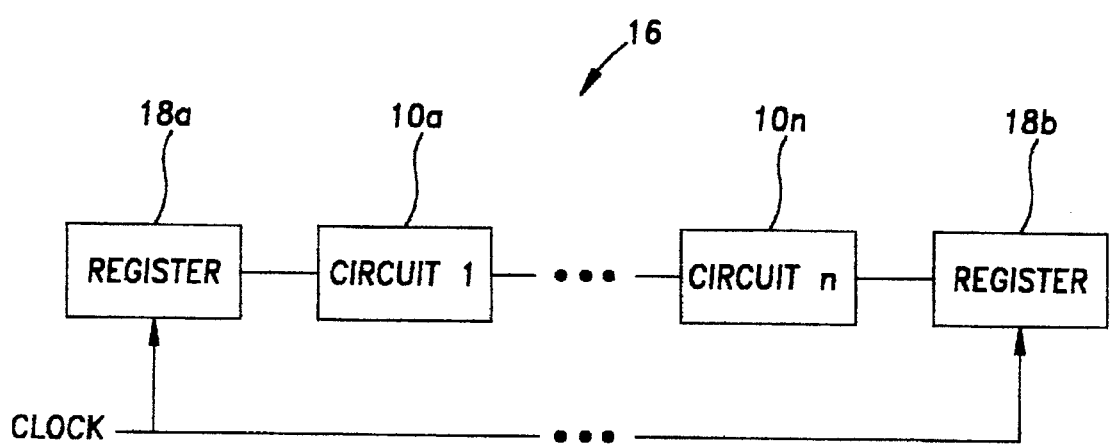
FIG. 2 is a network-level model of a plurality n of circuits shown in FIG. 1 bound by registers.

FIG. 2 is a network-level model of a network or "cone" 16, comprising a plurality of circuits 10a–10n shown in FIG. 1 bounded on each end by registers 18a and 18b. The individual circuits of a microprocessor may be partitioned into a set of these register bound "cones" of combinatorial logic. Within each cone, data signals are launched from register 18a, propagate through the logic represented by circuits 10a through 10n, and are captured in the other register 18b.

Each of the one or more circuits 10 within each cone provides a circuit propagation delay $t_{pd}$, so the total propagation delay for a signal traversing the cone is $\Sigma t_{pd}$. The one critical cone within the microprocessor that has the greatest propagation delay $\Sigma t_{pd}$ determines the minimum value for the period of the microprocessor clock cycle $t_{cycle}$, since:

$t_{cycle} \geq \Sigma t_{pd} + B$, where B=set-up, hold, and clock variation times allotted for that cone {EQ. 1}.

In other words, ignoring the hot-electron effects on the circuit propagation delay, and further ignoring the timing margin between data signal stability at the end of the cone (register 18b) and the end of the clock cycle ($t_{slack}$), the clock cycle time must be at least as great as the sum of circuit propagation delays $\Sigma t_{pd}$ within the cone plus B. In this manner, the proper design of a circuit insures that data and clock signals launched from a first register 18a propagate through combinatorial logic and are captured at the next register 18b before the occurrence of the next microprocessor clock signal.

Since circuit propagation delay is not constant over microprocessor lifetime, but increases due to hot-electron effects, it is necessary to modify EQ. 1 to assure the reliability of a microprocessor over its expected lifetime. Therefore, the tolerance of a microprocessor to withstand any circuit propagation delay degradation, $\Delta t_{pd}(\tau)/t_{pd}$, caused by the hot-electron effect, is assessed using the following criteria:

$t_{cycle} - \Sigma[t_{pd} \pm \Delta t_{pd}(\tau)] - B \geq t_{slack}$ {EQ. 2}

According to equation 2, the $t_{cycle}$ time must be greater than or equal to the sum of (i) the slack time allotted for a given cone, (ii) the circuit propagation delay for that cone, which accounts for circuit propagation delay degradation $\Delta t(\tau)$ due to hot-electron effects, and (iii) the set-up, hold, and clock variation times allotted for that cone. If it is not, timing equation 2 is violated. Equation 2, then, may be used to assess a microprocessor's tolerance to circuit propagation delay degradation occurring over its lifetime.

As explained earlier herein, a lower test voltage (guard-band voltage) may be used to test a batch of microprocessors to simulate drain current degradation, and hence the proportional circuit propagation delay degradation, which is likely to be experienced by the microprocessors at their end-of-life. The system of the present invention prevents the selection of a guard-band voltage which is too high or too low by providing a "self calibrating" method to quantify the guard-band voltage for a microprocessor's application specific technology, design and environment. The term "self-calibrating" means that the point at which a microprocessor is deemed to fail the timing test for a production yield of a batch of microprocessors automatically determines the point at which $t_{slack}=0$ (see EQ. 2).

The following procedures, as described below with further reference to FIGS. 3–6, outline the manner in which the tolerance of a microprocessor to withstand circuit propagation delay degradation $\Delta t_{pd}(\tau)$ is assessed over its lifetime for the degradation caused by hot-electron effects. The steps in the procedures below correspond generally to those shown in the flow charts of FIGS. 6A and 6B.

Figure 3:
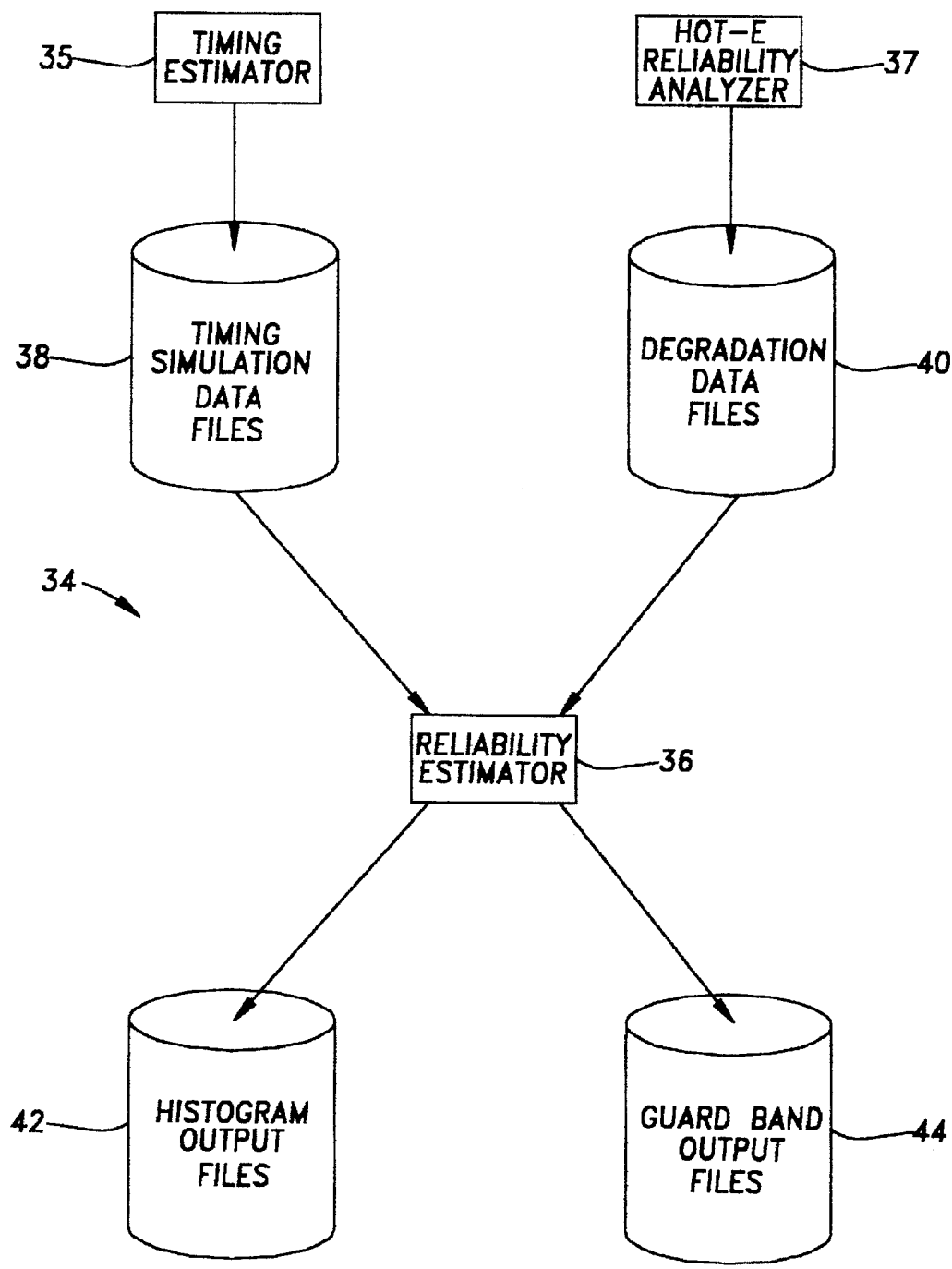
FIG. 3 is a block diagram of a system constructed according to the principles of the present invention, including analysis tools and various input files and output files used in the system.

FIG. 3 shows the elements used to construct a system 34 by which an appropriate guard-band voltage may be quantified for a microprocessor, including analysis tools 35–37, input files 38 and 40, and output files 42 and 44. As shown in FIG. 3, the input files and the output files take the form of hard disc storage, although other types of storage media are contemplated.

Because potentially millions of transistors may reside on a single microprocessor, the first step in the process to determine an appropriate guard-band voltage is to simplify the model of each circuit in the microprocessor to that shown in FIG. 1. The values for $R_{inv}$, $C_{load}$, as well as the propagation delay $t_{pd}(\tau)$ for the actual circuit, are available from the logic timing and microprocessor physical design data. The entire microprocessor is then partitioned into a plurality of cones 16 as shown in FIG. 2, with each cone 16 comprising n circuit level models (FIG. 1) bounded on each end by registers 18a and 18b. The partitioning may be accomplished using logic design timing tool 35, typically available to logic designers, such as the IBM® Early Timing Estimator (ETE), as disclosed in the Early Timing Estimator User's Guide, Manual 3325, Release 90.0.

The partitioning of the microprocessor into cones 16 by the timing estimator 35 simplifies the circuit analysis, because the inverter 14 is most susceptible to hot-electron effects. Because the magnitude of these hot-electron effects are related to inverter channel length ($L_{eff}$) and to inverter channel width, the sufficiency of a given circuit is evaluated based on the $C_{load}$ it sees. The magnitude of the drain current degradation $\Delta I_d(\tau)/I_d$ due to the hot-electron effect over a range of output driver power-levels ($V_{dd}$), output power channel lengths ($L_{eff}$), and output loads ($C_{load}$) is determined by a hot-electron reliability circuit-level tool, such as the IBM® ADCHECK (see, e.g. T. J. O'Gorman, ADCHECK Circuit Reliability Program, IBM® Microelectronics Division, May, 1994). Lastly, the system environment factors of power supply voltage ($V_{dd}$), case temperature ($T_{case}$), and lifetime δ are included in the calculations.

The timing simulation data provided by the timing estimator 35 is stored in timing simulation input data file 38. The timing estimator 35 creates this timing data based on analysis of circuit design parameters which represent the functional (timing) operation of the logic design, thereby providing the logic designer a means of estimating the timing at the logic level of FIG. 1. Accordingly, input file 38 contains information relating to the circuit $R_{int}$, $C_{load}$, $t_{pd}$, $t_{cycle}$, and slack information for all register-bound cones on a microprocessor. Based on the data contained in timing simulation data file 38, values for the following variables are tabulated for each circuit in each cone 16 in the microprocessor: inverter channel width, $C_{load}$, and circuit propagation delay $t_{pd}$. Based on these tabulated values, critical cones in the microprocessor having insufficient slack are identified.

The second step in the process, which can be performed independently from and hence concurrently with the first step, is to use a hot-electron reliability circuit-level tool 37, such as ADCHECK, to consider the hot-electron effects on propagation delay degradation during circuit level design for each inverter in the circuit. The hot-electron reliability tool 37 is used to create an input file 40 which stores a degradation database containing information relating to the actual physical design characteristics of a circuit (i.e. a physical design circuit library). This information results from timing measurements due to hot-electron effects, and may be provided by a commercially available circuit simulation tool such as SPICE or ASTAP.

The hot-electron reliability tool 37 permits circuit operation to be simulated using inverter and resistor models to determine the degradation effects which are to be expected for a particular circuit library. In this manner, the degradation database is created to include a numerical array of inverter circuit propagation delays $t_{pd}$ which are calculated as a function of the variables of inverter signal rise time, $C_{load}$, effective inverter channel length ($L_{eff}$), and inverter channel width. This degradation database input file 40 effectively calibrates the analysis tool 36 using the physical design circuit library under the expected degradation conditions.

The third step in the process is to use a hot-electron reliability chip-level simulation tool 36 (e.g IBM® Early Reliability Estimator (ERE)) to determine the difference between the propagation delays of the most critical cones at the microprocessor beginning-of-life (BOL) and at end-of-life (EOL) to determine propagation delay degradation $\Delta t_{pd}(\tau)$ for the microprocessor. The analysis tool 36 is implemented in the form of a software program which takes the circuit-level timing simulation data from input file 38 and the circuit-level degradation data from input file 40 to compile histograms such as that shown in FIG. 4 which are stored in output files 42. These histograms include beginning-of-life (BOL) histograms and end-of-life (EOL) histograms. The histograms are graphical representations of a frequency distribution of the number of circuit paths in a microprocessor versus the circuit propagation delay $t_{pd}$ for these paths. The histograms therefore provide a history of all the propagation delays for all of the circuit paths microprocessor.

Figure 4:
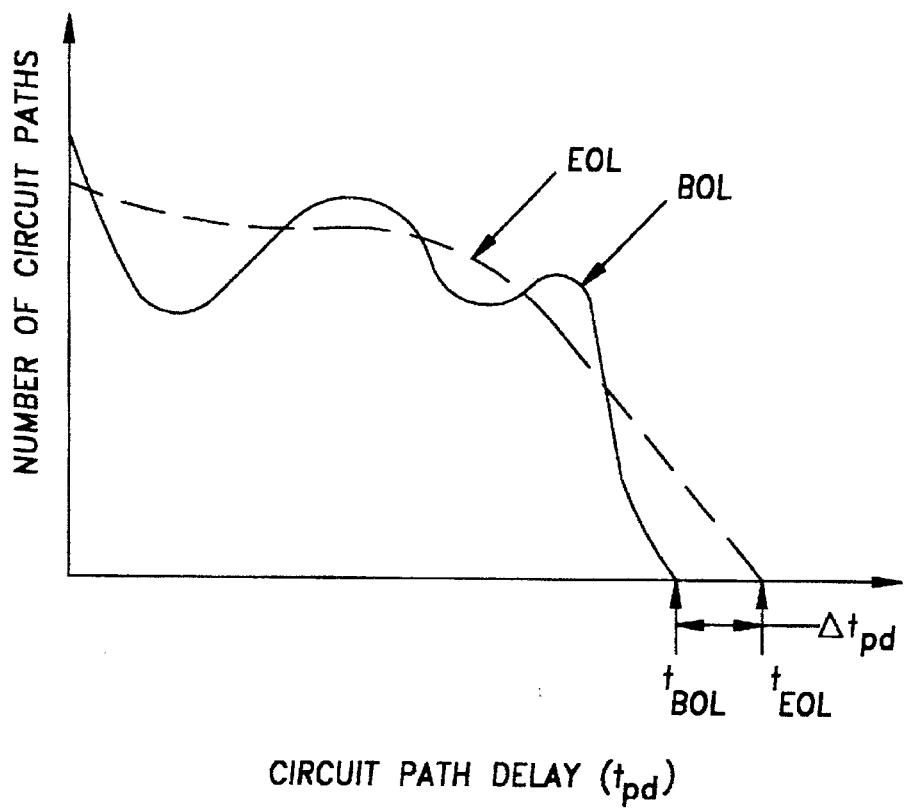
FIG. 4 is a histogram of critical path delays for the circuits shown in FIG. 2 under beginning-of-life conditions and end-of-life conditions.
Figure 5:
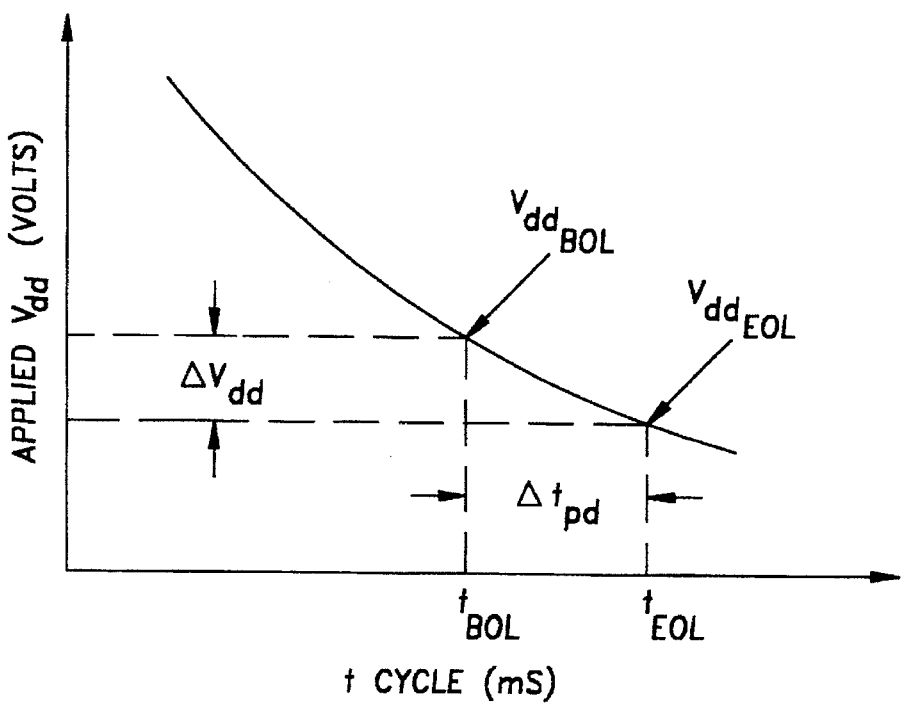
FIG. 5 is a graphical representation of microprocessor operating voltage versus microprocessor clock cycle time.
Figure 6A:
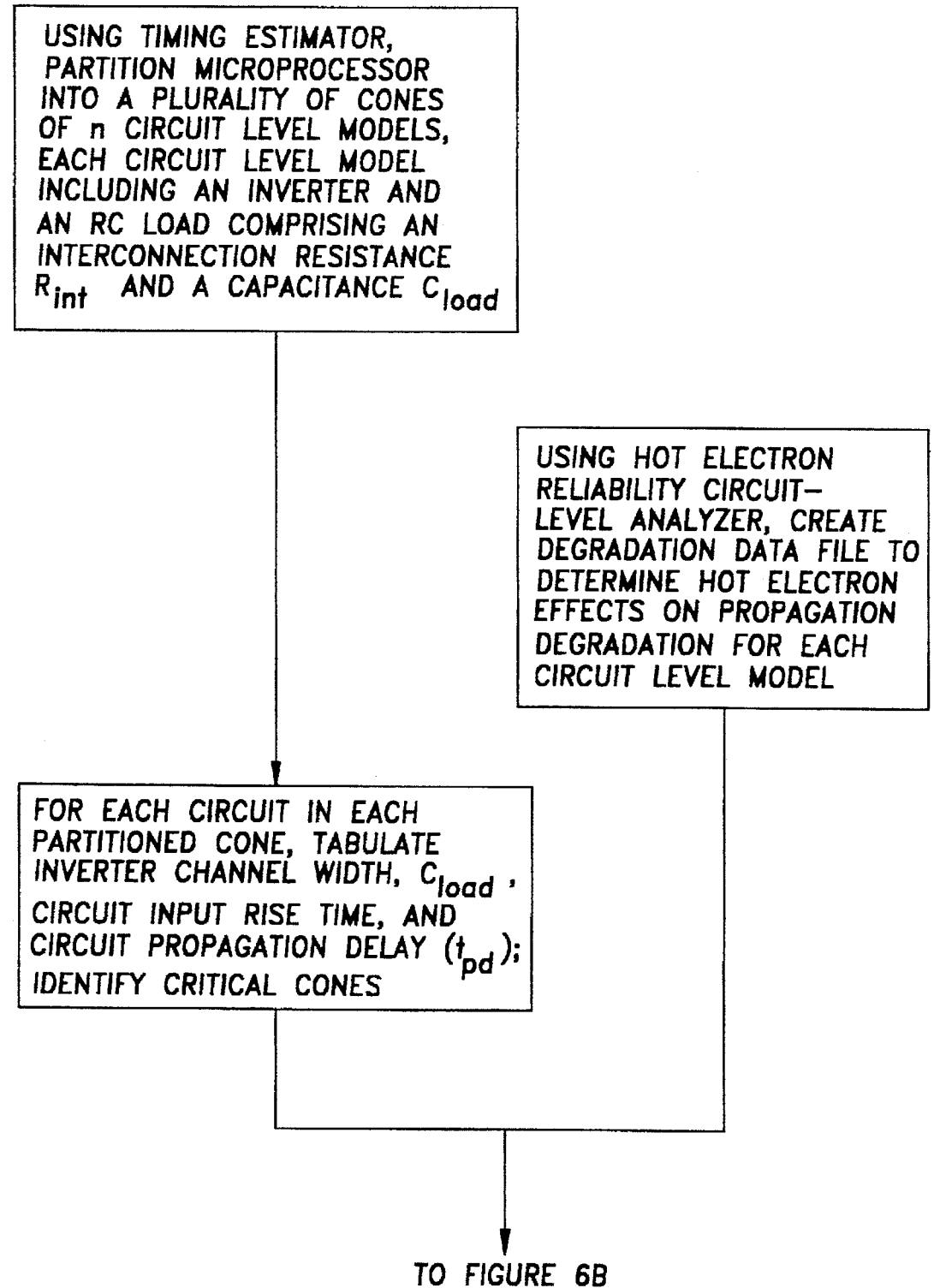

As shown in FIG. 4, the histograms tail off to a point at which the circuits in the most critical cones provide the greatest circuit propagation delay $t_{pd}$. Circuit propagation delay $t_{pd}$ generally increases (degrades) over the life of the microprocessor, from $t_{pd(BOL)}$ at beginning-of-life to $t_{pd(EOL)}$ at end-of-life. The tail ends of the histograms are representative of the phenomenon that when a timing test is applied to sort the fastest microprocessors from a production yield, it is a statistical certainty that some fraction of the microprocessors will pass the test with some circuits having little or no timing margin. Time $t_{BOL}$ represents the cut-off point for those circuits having no timing margin to spare at beginning-of-life, and time $t_{EOL}$ represents the cut-off for those circuits having no timing margin to spare at end-of-life.

FIG. 4 shows the shift in propagation delays expected over the lifetime of a microprocessor and the number of circuits experiencing the shift. The difference between times $t_{BOL}$ and $t_{EOL}$ results from the fact that over the lifetime of the microprocessor, additional delay will creep into the critical logical cones, causing intermittent failures. This additional propagation delay degradation is represented as:

$$\Delta t_{pd}(\tau) = t_{pd(EOL)} - t_{pd(BOL)} \qquad \{EQ.\ 3\}$$

The fourth step in the process is to experimentally measure the applied power supply voltage $V_{dd}$ necessary to pass a functional test over a range of microprocessor cycle times $t_{cycle}$. That is, as $V_{dd}$ is varied (decreased) with a calibrated voltage supply, the frequency (i.e. the inverse of $t_{cycle}$) of a calibrated frequency generator is correspondingly decreased, so that the microprocessor continues to operate at the lowered voltage. In this manner, a table or graph such as that shown in FIG. 5 may be experimentally created to express the power supply voltage $V_{dd}$ required for the microprocessor to operate as a function of microprocessor cycle time $t_{cycle}$.

The fifth and last step in the process is to determine the appropriate guard-band voltage for a particular microprocessor based on (i) the propagation delay degradation $\Delta t_{pd}(\tau)$ arrived at in the third step which is expected to be experienced by the critical logical cones over the life of the microprocessor; and (ii) the experimental graph obtained in the fourth step for expressing the power supply voltage $V_{dd}$ required for the microprocessor to operate as a function of microprocessor cycle time $t_{cycle}$. The change in $V_{dd}$ which corresponds to the change in propagation delay degradation $\Delta t_{pd}(\tau)$ is referred to as $\Delta V_{dd}$ or $V_{dd(guard-band)}$ which corresponds to the voltage differential represented by the following equation:

$$\Delta V_{dd} = V_{dd(guard-band)} = V_{dd@BOL} - V_{dd@EOL} \qquad \{EQ.\ 4\}$$

The guard-band voltage determined from EQ. 4 is then used to test each microprocessor. Microprocessors which operate at the lower applied voltage $V_{dd@EOL}$ are presumed to be capable of withstanding the expected propagation delay degradation at end-of-life caused by the hot-electron effect. Microprocessors which fail to operate at the lower applied voltage $V_{dd@EOL}$ are presumed to be incapable of withstanding the expected propagation delay degradation at end-of-life caused by the hot-electron effect. Data representing the survival/non-survival rates of the tested microprocessor chips are also stored in output file 44.

Accordingly, the preferred embodiment of a method for assessing microprocessor reliability, by calculating a hot-electron test voltage differential, has been described. With the foregoing description in mind, however, it is understood that this description is made only by way of example, that the invention is not limited to the particular embodiments described herein, and that various rearrangements, modifications and substitutions may be implemented without departing from the true scope of the invention as hereinafter defined by the following claims and their equivalents.

We claim:

1. A method of determining a guard band voltage differential, used in testing a microprocessor, which represents operating conditions which are anticipated at the end-of-life for the microprocessor, comprising the steps of:

(i) partitioning a microprocessor into a plurality of cones of n circuit level models;

(ii) creating a timing simulation data file containing timing simulation data representing timing operation for a circuit path for each of said circuit level models;

(iii) creating a degradation data file containing degradation data representing hot-electron effects on propagation delay degradation for each of said circuit level models;

(iv) identify critical cones in the microprocessor having insufficient slack;

(v) using said timing simulation data and said degradation data, identify propagation delay for each of said circuit paths for said circuit level models at times corresponding to the beginning-of-life and end-of-life of the microprocessor;

(vi) determine a timing difference between propagation delay for said critical cones at the beginning-of-life and end-of-life of the microprocessor to calculate propagation delay degradation;

(vii) experimentally determine a range of applied power supply voltages necessary to successfully perform a functional test of the microprocessor over a corresponding range of microprocessor cycle times; and (viii) determine a guard band voltage differential based on said calculated propagation delay degradation and on said determined range of applied power supply voltages.

2. The method of claim 1, further comprising the step of testing the microprocessor at the determined guard band voltage differential.

3. The method of claim 1, wherein each of said partitioned circuit level models includes an inverter and a capacitance $C_{load}$.

4. The method of claim 3, further comprising the step of tabulating for each of said circuit level models values for physical characteristics of said model.

5. The method of claim 4, wherein said tabulated physical characteristics include inverter channel width, capacitance $C_{load}$, circuit input rise time, and circuit path propagation delay.

6. The method of claim 1, wherein said partitioning step is accomplished using a timing estimator.

7. The method of claim 6, wherein said timing simulation data is created by said timing estimator and said degradation data is created by a hot electron reliability circuit-level analyzer.

8. The method of claim 1, wherein said step of identifying propagation delay for each of said circuit level models includes the steps of compiling beginning-of-life (BOL) histograms and end-of-life (EOL) histograms providing a history of all of the propagation delays for all of the circuit paths in the microprocessor.

9. The method of claim 1, wherein said degradation data file includes a numerical array of inverter circuit propagation delays $t_{pd}$ as a function of the variables of inverter signal rise time, $C_{load}$, effective inverter channel length ($L_{eff}$), and inverter channel width.

* * * * *